United States Patent [19]

Hattori

[11] Patent Number: 4,759,222

[45] Date of Patent: Jul. 26, 1988

[54] PRESSURE RESPONSIVE SWITCH

[75] Inventor: Kenji Hattori, Saitama, Japan

[73] Assignee: Honda Giken Kogyo Kabushiki Kaisha, Tokyo, Japan

[21] Appl. No.: 937,707

[22] Filed: Dec. 4, 1986

[30] Foreign Application Priority Data

Dec. 13, 1985 [JP] Japan .............................. 60-192705[U]

[51] Int. Cl.$^4$ ................................................ G01L 9/10
[52] U.S. Cl. ...................................... 73/722; 340/626; 92/6 D; 324/208; 200/83 J; 200/83 W
[58] Field of Search ................. 73/717, 722, 723, 728; 340/626; 307/118; 91/416, 519; 92/6 D, 6 R, 101; 324/207, 208; 200/81 R, 83 J, 83 R, 83 B, 83 W, 83 L; 361/177, 178, 179, 180

[56] References Cited

U.S. PATENT DOCUMENTS

| | | | |
|---|---|---|---|
| 3,090,848 | 5/1963 | Scholz | 200/83 W |
| 3,154,652 | 10/1964 | Gilman | 200/83 W |
| 3,393,612 | 7/1968 | Gorgens | 200/83 J |
| 4,227,171 | 10/1980 | Masuda | 200/83 L |
| 4,395,916 | 8/1983 | Martin | 73/722 |

Primary Examiner—G. P. Tolin
Attorney, Agent, or Firm—Lyon & Lyon

[57] ABSTRACT

A pressure responsive switch including a case having a pressure inlet and an orifice plate, an amorphous diaphragm and a ferrite core arranged in said case, said ferrite core having a pick-up coil housed therein, in which a pressure introduced into the case acts through the orifice plate against a surface of the amorphous diaphragm and a mechanical deformation of said amorphous diaphragm caused by said pressure is detected as a variation of electrical signal by means of the pick-up coil. The characteristic feature resides in that said orifice plate has a larger area at its side facing the ferrite core than at its opposite side facing the pressure inlet.

4 Claims, 2 Drawing Sheets

PRESSURE RESPONSIVE SWITCH

BACKGROUND OF THE INVENTION

1. Field of the Invention

The present invention relates to an improvement in a pressure responsive switch of the amorphous diaphragm type.

2. Description of the Prior Art

The pressure responsive switch of this type heretofore employed has a construction, as shown in FIG. 3, in which a case 1 has a pressure inlet 2 and an inner chamber 3 into which a fluid pressure P such as oil pressure is introduced through said inlet 2, and a superposed assembly of an amorphous diaphragm 7 and a ferrite core 9 is slidably arranged in said case for sliding movement along the inside wall of said inner chamber 3, with a sealing O-ring 4 being interposed therebetween. The superposed assembly of the amorphous diaphragm and the ferrite core is supported by a pressure receiving plate 10 by means of set screw or the like. A mechanical deformation of the amorphous diaphragm caused by the fluid pressure acting on a surface of the amorphous diaphragm 7 is detected in the form of a variation of electrical signal by means of a pick-up coil 8 housed in a groove formed in the ferrite core 9.

According to the conventional construction of the pressure responsive switch as described above, the fluid pressure P fed into the inner chamber 3 of the case through the pressure inlet 2 directly acts upon the superposed assembly. Since the ferrite core 9 receiving such pressure is made of a sintered body, the intensity of the pressure P that can be introduced into the case 1 is limited.

OBJECT OF THE INVENTION

It is a general object of the present invention to eliminate the disadvantage of the prior art as described above.

It is a specific object of the present invention to provide an improvement in a pressure responsive switch in which a load applied on a unit area of the ferrite core is reduced relatively to an intensity of the pressure introduced into the case, whereby the pressure resistant property of the pressure responsive switch is improved.

SUMMARY OF THE INVENTION

In order to attain the object as described above, the present invention provides a pressure responsive switch including a case having a pressure inlet and an orifice plate, an amorphous diaphragm and a ferrite core arranged in said case, said ferrite core having a pick-up coil housed therein, in which a pressure introduced into the case through said pressure inlet acts through the orifice plate against a surface of the amorphous diaphragm and a mechanical deformation of said amorphous diaphragm caused by said pressure is detected in the form of a variation of electrical signal by means of said pick-up coil, characterized in that said orifice plate has a larger area at its side facing the ferrite core than at its opposite side facing the pressure inlet.

DETAILED DESCRIPTION OF THE PREFERRED EMBODIMENT

Now an embodiment of the present invention will be described in detail, with reference to the drawings.

Figure 1:
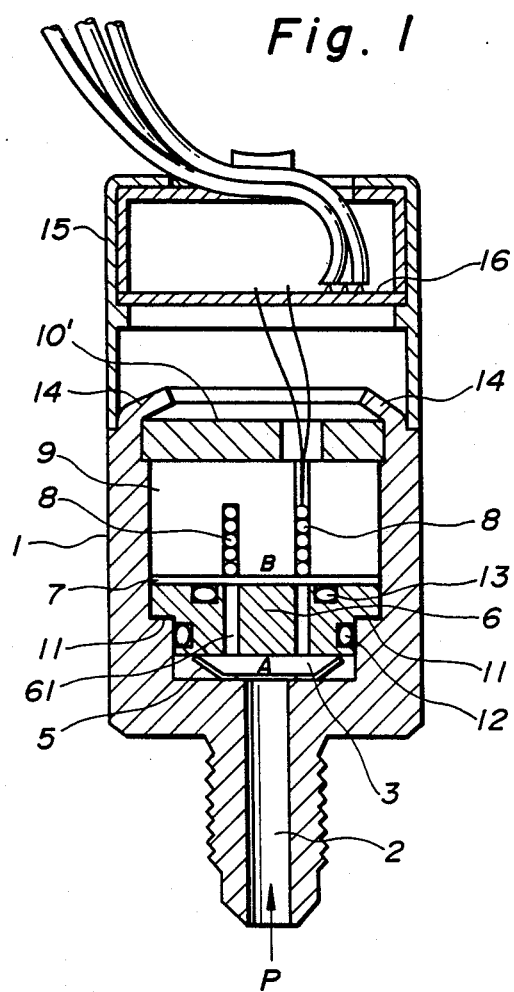
FIG. 1 is a sectional view showing an embodiment of the pressure responsive switch according to the present invention.

The pressure responsive switch according to the present invention, as shown in FIG. 1, includes a case 1 having a pressure inlet and a superposed assembly of an orifice plate 6, an amorphous diaphragm 7 and a ferrite core 9, which are slidable into case 1 during assembly of the pressure responsive switch, a dish-shaped spring 5 being interposed between the case and said assembly. Spring 5 exerts an initial load on orifice plate 6, which puts O-ring 13 under compression thus ensuring a complete seal between O-ring 13 and the amorphous diaphragm 7 even if the axial size of the superposed assembly varies which might cause fluid leakage between O-ring 13 and the amorphous diaphragm 7 without spring 5. Spring 5 also ensures that substantially no variation in initial load acts on orifice plate 6, even if there is axial error in positioning the pressure receiving plate 10' onto the case 1. The above-mentioned assembly is attached to a pressure receiving plate 10' by crimping or the like. Particularly, according to this embodiment, the case 1 is formed with a stepped portion 11 on its inside wall and the orifice plate 6 is formed with a stepped portion corresponding to the stepped portion 11 of the inside wall of the case, so that the area B of the orifice plate 6 at the side facing the amorphous diaphragm 7 (which is equal to the area of the ferrite core 9) is larger than the area A of said orifice plate at the side receiving the pressure P fed into the case.

The orifice plate 6 has orifices 61 formed therein to transmit the pressure fed into the case 1 to the surface of the amorphous diaphragm 7. The orifice plate 6 further has an O-ring 12 for sealing the side surface thereof and an O-ring 13 for sealing the flat surface thereof.

In the construction as described above, it is assumed that a load applied to the surface of the orifice plate 6 at the side receiving the pressure P fed into the case 1 is W ($= A \times P$). Then, a unit load w applied to a unit area of the ferrite core 9 through the amorphous diaphragm is given by the following formula:

$$w = W/B \qquad (1)$$
$$= P \cdot A/B$$

In other words, the unit load w applied to the unit area of the ferrite core 9 owing to the pressure P introduced into the case 1 is proportional to the area ratio $A/B$ ($A < B$) of the opposite surfaces of the orifice plate 6.

Figure 2:
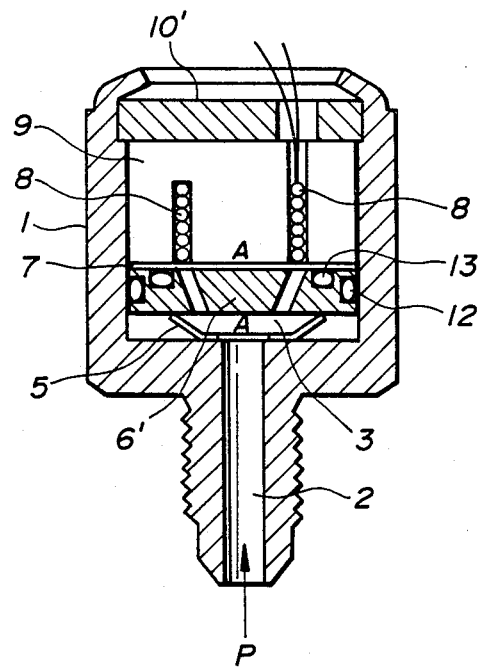
FIG. 2 is a partial sectional view showing the pressure responsive switch in which there is no difference in area between the opposite surfaces of the orifice plate.

If no stepped portion is formed on an orifice plate 6' as shown in FIG. 2, the unit load w' applied to the unit area of the ferrite core 9 owing to the pressure P introduced into the case is given by the following formula:

$$w' = W/A \qquad (2)$$

From the above relation expressed by the formula (1) and the formula (2), the unit load w' is expressed by the following formula:

$$w = w' \cdot A/B \quad (3)$$

Thus, the unit load w applied to the unit area of the ferrite core 9 by the orifice plate 6 having the stepped portion to form the relation A<B can be made smaller than the unit load w' applied to the unit area of the ferrite core 9 by the orifice plate 6' having no stepped portion to form the relation A=B, by reducing the ratio of A/B, of the areas of the opposite surfaces of the orifice plate.

Accordingly, the pressure resistant property of the ferrite core 9 is improved, so that the available range of the pressure switch under high pressure can be effectively increased.

Assuming that the area in the flat surface sealing O-ring 13 of the orifice plate 6 is C, the pressure applied to the area A is equal to that applied to the area C since these areas are communicated with each other through the orifices 61. Accordingly, when the fluid pressure is increased, the orifice plate 6 is pressed to the ferrite core 9, due to the greater force exerted on area A by virtue of its having a larger pressure receiving area than area C.

At this stage, when the pressure is increased to some extent, the orifice plate 6 and the amorphous diaphragm 7 come into intimate contact with each other, expelling the pressure medium such as oil from the space between the orifice plate 6 and the amorphous diaphragm 7 through the orifices 61 except for a small amount corresponding to the amount of deformation of the amorphous diaphragm 7 into the groove portion formed in the ferrite core 9. The deformation of the amorphous diaphragm 7, however, does not result in physical movement of pick-up coil 8 nor in relative movement of pick-up coil 8 and ferrite core 9.

Figure 3:
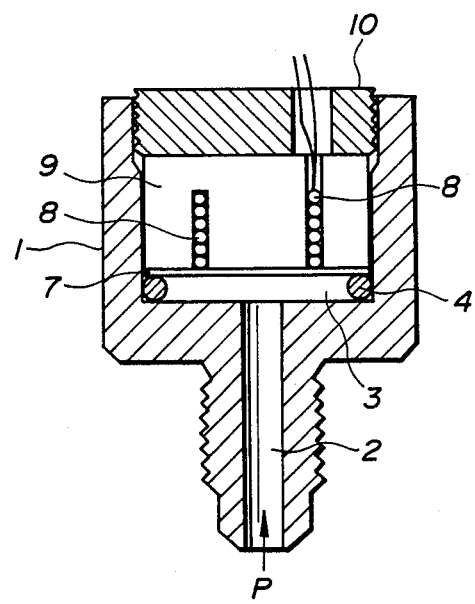
FIG. 3 is a sectional view of the conventional pressure responsive switch.

The deformation of the amorphous diaphragm 7 is detected by pick-up coil 8 in the form of a variation of the electrical signal, as is conventional with the prior art device of FIG. 3. The diaphragm is made of magnetic material having a large stress-magnetic effect. When the diaphragm is deformed by pressure into the groove of the ferrite core 9 in which the pick-up coil 8 is housed, stress is produced in that part of the diaphragm which reduces its permeability due to the stress-magnetic effect and thus reduces inductance of the magnetic circuit including the diaphragm and the ferrite core. This reduction in inductance is detected by pick-up coil 8.

In FIG. 1, 14 indicates a crimped portion of the end of the case 1, 15 indicates a circuit unit integrally fixed on the end of the case by welding or the like, and 16 indicates a substrate of the circuit. Although the pressure receiving plate 10' is shown as fixed to the case 1 by crimping, it may be fixed to the case by the other fixing means, such as threading or the like.

It will be understood that the pressure responsive switch according to the present invention is so constructed that the pressure introduced into the case acts through the orifice plate against the superposed assembly of the amorphous diaphragm and the ferrite core and said orifice plate has a smaller area at its side facing the ferrite core (inside of the O-ring 13) than at its opposite pressure receiving side facing the pressure inlet (at the diameter of O-ring 12). Such construction provides a superior advantage in that the unit load applied to the unit area of the ferrite core can be reduced relatively to the pressure introduced into the case, so that the pressure-resistant property of the pressure switch can be improved.

I claim:

1. In a pressure responsive switch including a case having a pressure inlet and an orifice plate, an amorphous diaphragm and a ferrite core arranged in said case, said ferrite core having a pick-up coil housed therein, in which a pressure medium introduced into the case acts through the orifice plate against one surface of the amorphous diaphragm and a mechanical deformation of said amorphous diaphragm caused by said pressure is detected as a variation of electrical signal by means of said pick-up coil; an improvement in which said orifice plate is provided with a first sealing means engaging said case and defining a first effective pressure area and a second sealing means engaging said one surface of the amorphous diaphragm and defining a second effective pressure area smaller than the first effective pressure area, and said first and second effective pressure areas being subjected to said pressure medium for producing a lower total force on said amorphous diaphragm than on said orifice plate.

2. A pressure responsive switch according to claim 1 in which the case is formed with a stepped portion on its inside wall and the orifice plate is formed with a stepped portion corresponding to the stepped portion of the inside wall of the case, said first sealing means engaging the stepped portions of the case and orifice plate so that the area of the orifice plate at the side facing the amorphous diaphragm is larger than the area of said orifice plate at the side receiving the pressure fed into the case.

3. A pressure responsive switch comprising a case having an inner chamber open at its one end and closed at its other end and having a pressure inlet formed at said closed end, said inner chamber having a stepped portion formed on its inner surface to reduce the diameter of the inner chamber at the pressure inlet side, a core housed n said case at the side of said open end and having a coil housed in a groove formed therein at the side of the pressure inlet, an amorphous diaphragm arranged in case so as to make contact with the surface of the core having said groove opening therein, a plate having a smaller diameter portion and a larger diameter portion with a stepped portion arranged to make engagement with the above-mentioned stepped portion, said plate being arranged in the case so as to contact at its larger diameter surface with the amorphous diaphragm and having a passage to communicate the pressure inlet side thereof with the amorphous diaphragm side, a flat sealing member arranged between the plate and the amorphous diaphragm, a side sealing member arranged between the side of the smaller diameter portion of the plate and the case, a spring member arranged between the plate and the case to press said plate toward the amorphous diaphragm, and a pressure receiving plate attached to the open end of the case and arranged to close said open end.

4. A pressure responsive switch according to claim 3, in which said pressure responsive plate is fixed to the case by causing said plate to engage with the stepped portion formed at the open end of the case and crimping the end of the case to fixedly connect them.

* * * * *